(12) United States Patent
Fujii

(10) Patent No.: US 8,390,028 B2
(45) Date of Patent: Mar. 5, 2013

(54) SEMICONDUCTOR DEVICE WITH EPITAXIAL CRYSTAL LAYER EMBEDDED WITHIN SUSBSTRATE OF DUMMY PATTERN REGION

(75) Inventor: Osamu Fujii, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 21 days.

(21) Appl. No.: 13/069,607

(22) Filed: Mar. 23, 2011

(65) Prior Publication Data

US 2012/0091505 A1 Apr. 19, 2012

(30) Foreign Application Priority Data

Oct. 14, 2010 (JP) ................. 2010-231633

(51) Int. Cl.
*H01L 21/02* (2006.01)
(52) U.S. Cl. ........ 257/190; 257/524; 257/510; 257/513; 257/63; 257/64; 257/E29.068
(58) Field of Classification Search .................. 257/190, 257/E29.068, 524, 510, 513, 63–65
See application file for complete search history.

(56) References Cited

U.S. PATENT DOCUMENTS

| 6,847,093 | B2 * | 1/2005 | Ichinose et al. | ............... | 257/524 |
| 2006/0202234 | A1 * | 9/2006 | Hara | ............... | 257/213 |
| 2007/0085164 | A1 * | 4/2007 | Wise et al. | ............... | 257/506 |
| 2008/0237689 | A1 * | 10/2008 | Kitano | ............... | 257/316 |

FOREIGN PATENT DOCUMENTS

JP 06-216037 8/1994

OTHER PUBLICATIONS

O. Fujii, et al., "Sohpisticated Methodology of Dummy Pattern Generation for Suppressing Dislocation Induced Contact Misalignment on Flash Lamp Annealed eSiGe Wafer", Symposium on VLSI Technology Digest, 2009, pp. 156.

* cited by examiner

*Primary Examiner* — Eugene Lee
*Assistant Examiner* — Elias M Ullah
(74) *Attorney, Agent, or Firm* — Turocy & Watson, LLP

(57) ABSTRACT

A semiconductor device according to one embodiment includes an element isolation insulating film formed on a substrate, an element region and a dummy pattern region demarcated by the element isolation insulating film on the substrate, a first epitaxial crystal layer formed on the substrate within the element region, and a second epitaxial crystal layer formed on the substrate within the dummy pattern region. The first epitaxial crystal layer is made up of crystals that have a different lattice constant from that of the crystals that constitute the substrate. The second epitaxial crystal layer is made up of the same crystals as the first epitaxial crystal layer. The (111) plane of the substrate that includes any points on the interface between the second epitaxial crystal layer and the substrate is surrounded by the element isolation insulating film in a deeper region than the second epitaxial crystal layer.

16 Claims, 11 Drawing Sheets

US 8,390,028 B2

SEMICONDUCTOR DEVICE WITH EPITAXIAL CRYSTAL LAYER EMBEDDED WITHIN SUSBSTRATE OF DUMMY PATTERN REGION

CROSS-REFERENCE TO RELATED APPLICATIONS

This application is based upon and claims the benefit of priority from the prior Japanese Patent Application No. 2010-231633, filed on Oct. 14, 2010, the entire contents of which are incorporated herein by reference.

FIELD

Embodiments described herein relate generally to semiconductor device.

BACKGROUND

It is known that, when semiconductor crystals are epitaxially grown on semiconductor crystals that have a different lattice constant from that of the epitaxially-grown semiconductor crystals, misfit dislocation may be generated on the interface between them and tend to propagate along the (111) plane in the epitaxially-grown crystals.

DETAILED DESCRIPTION

A semiconductor device according to one embodiment includes an element isolation insulating film formed on a substrate, an element region and a dummy pattern region demarcated by the element isolation insulating film on the substrate, a first epitaxial crystal layer formed on the substrate within the element region, and a second epitaxial crystal layer formed on the substrate within the dummy pattern region. The first epitaxial crystal layer is made up of crystals that have a different lattice constant from that of the crystals that constitute the substrate. The second epitaxial crystal layer is made up of the same crystals as the first epitaxial crystal layer. The (111) plane of the substrate that includes any points on the interface between the second epitaxial crystal layer and the substrate is surrounded by the element isolation insulating film in a deeper region than the second epitaxial crystal layer.

First to fourth embodiments according to the present invention will be described below with reference to drawings.

(First Embodiment)

Figure 1:
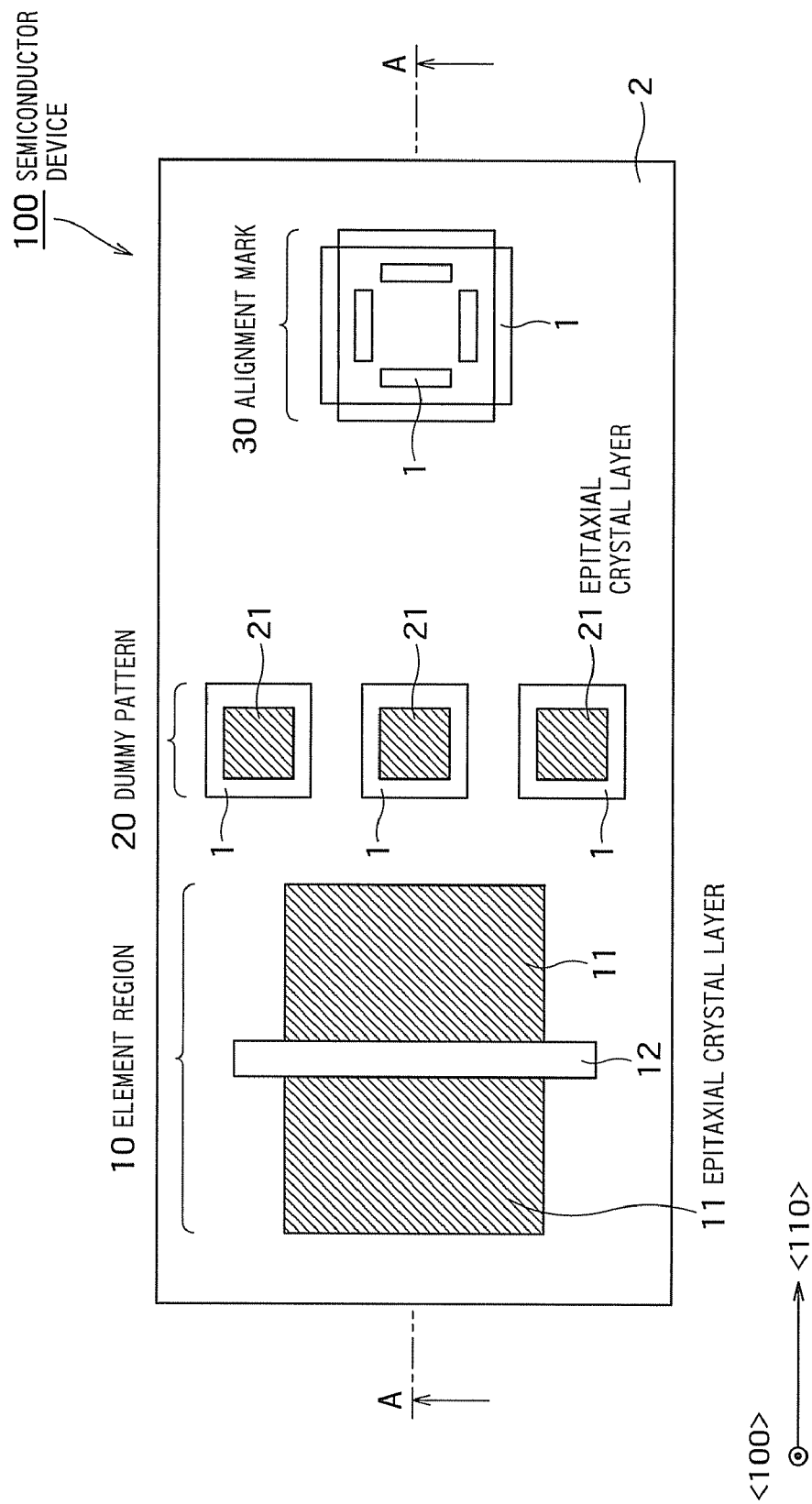
FIG. 1 is a top view of a semiconductor device according to a first embodiment of the present invention.
Figure 2:
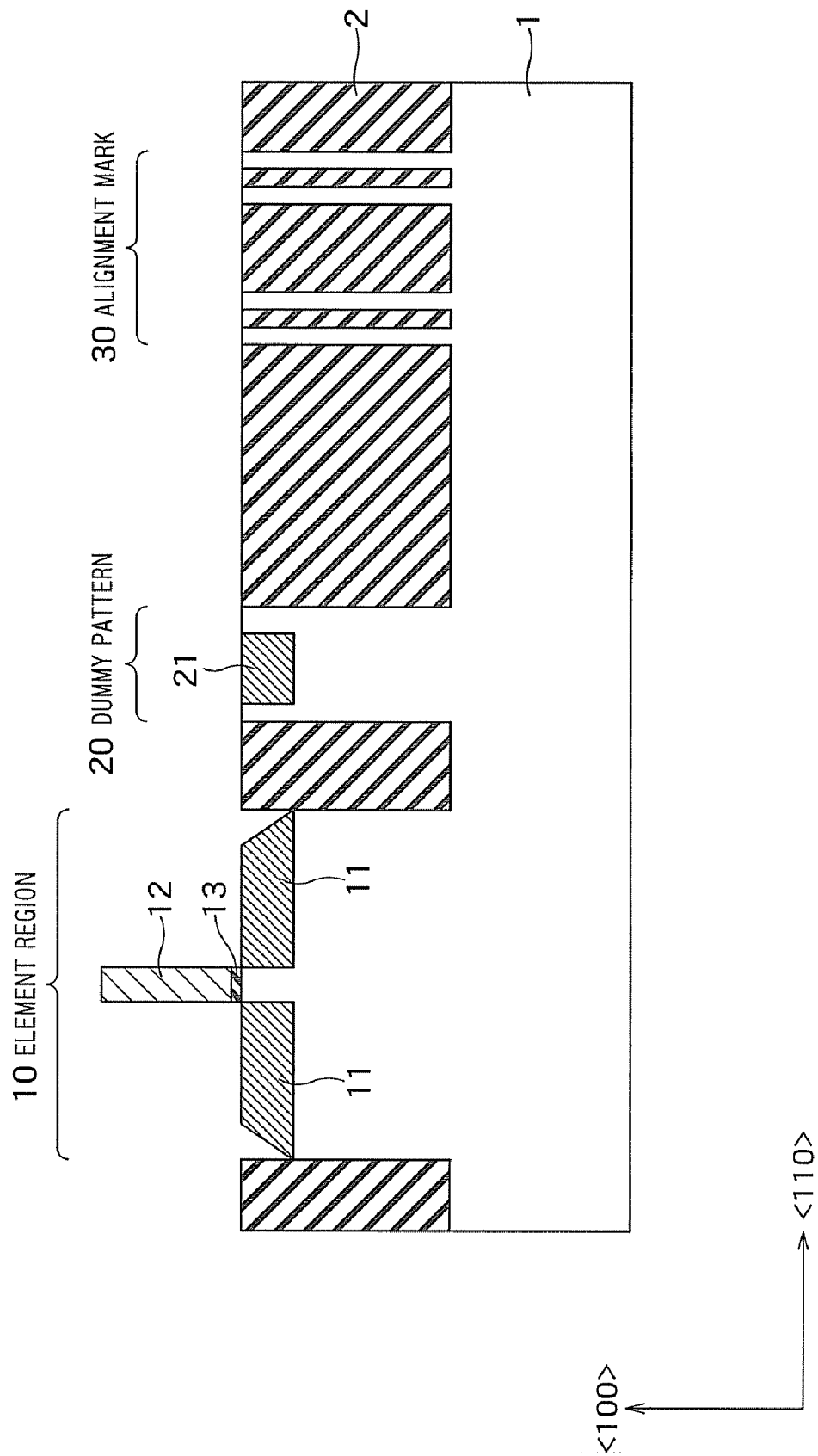
FIG. 2 is a vertical sectional view of the semiconductor device taken on line A-A of FIG. 1.

FIG. 1 is a top view of a semiconductor device 100 according to the first embodiment. FIG. 2 is a vertical sectional view of the semiconductor device 100 taken on line A-A of FIG. 1.

The semiconductor device 100 includes an element isolation insulating film 2 formed on a substrate 1, an element region 10 demarcated by the element isolation insulating film 2 on the substrate 1, a dummy pattern region 20, an alignment mark 30, an epitaxial crystal layer 11 formed on the substrate 1 within the element region 10, and an epitaxial crystal layer 21 formed on the substrate 1 within the dummy pattern region 20.

The substrate 1 is made up of Si based crystals, such as Si crystals. A plane direction of the principal surface of the substrate 1 is (100).

The element isolation insulating film 2 is made up of an insulating material, for example, $SiO_2$ and is formed within an STI (Shallow Trench Isolation) structure.

In the element region 10, a planar-type transistor that includes a gate electrode 12 formed via a gate insulating film 13 on the substrate 1 and the epitaxial crystal layer 11 formed on both sides of the gate electrode 12 on the substrate 1 is formed as shown in FIG. 2.

The epitaxial crystal layer 11 is made up of crystals that have a different lattice constant from that of the crystals that constitute the substrate 1, and is used for, e.g., a strained silicon technology in which the generation of strain in the channel region of the transistor allows carrier mobility to be improved. More specifically, when the substrate 1 is made up of Si crystals, SiGe or SiC crystal etc. is used as the epitaxial crystal layer 11. Incidentally, in the present embodiment, it is only required to include the epitaxial crystal layer 11 on the surface of the substrate 1 within the element region 10, and an elemental device except a planar-type transistor may be formed within the element region 10.

The dummy pattern region 20 includes the epitaxial crystal layer 21 that is made up of the same crystal as the epitaxial crystal layer 11. Since the epitaxial crystal layer 11 and the epitaxial crystal layer 21 are formed under the same process, the epitaxial crystal layer 21 has almost the same thickness as that of the epitaxial crystal layer 11.

The reason why the epitaxial crystal layer 21 is formed within the dummy pattern region 20 will be described here. When the epitaxial crystal layer 11 is epitaxially grown, it is desirable that epitaxial crystals (SiGe crystals etc.) that constitute the epitaxial crystal layer 11 on the substrate 1 are distributed less ununiformly because, when epitaxial crystals are widely distributed on the substrate 1, high-quality crystals can be epitaxially grown; thereby, the high-quality epitaxial crystal layer 11 can be achieved.

For the reason described above, to reduce the ununiformity of the distribution of epitaxial crystals on the substrate 1, epitaxial crystals are formed within the dummy pattern region 20 to form the epitaxial crystal layer 21.

In addition, the epitaxial crystal layer 21 is structurally preferably surrounded by the substrate 1 within the dummy pattern region 20 as shown in FIGS. 1 and 2. That is, the epitaxial crystal layer 21 is embedded within a trench formed on the surface of the substrate 1, and the bottom surface and the side surface of the epitaxial crystal layer 21 structurally preferably contact the substrate 1. The reason why the epitaxial crystal layer 21 is formed in a manner that is embedded within the trench formed on the surface of the substrate 1 as described above because epitaxial crystals can be grown on the substrate 1 that is made up of Si based crystals, while it cannot be grown on the element isolation insulating film 2 that is made up of $SiO_2$ etc.

If crystals are epitaxially grown, for example, within a trench whose bottom surface is the substrate 1 and whose side surface is the element isolation insulating film 2, since crystals cannot be grown on the element isolation insulating film 2, a facet face will be generated in the crystals; thus, the trench will not be filled with the crystals with no space between the crystals and the side surface of the trench. When the area of the epitaxial crystal layer 21 is relatively small, the generation of the facet face greatly affects the volume of the epitaxial crystal layer 21. Therefore, it is not desirable to use the trench whose side surface is the element isolation insulating film 2 to form the epitaxial crystal layer 21.

The alignment mark 30 is a mark defined using the region surrounded by the element isolation insulating film 2 on the surface of the substrate 1, and is used for alignment when performing exposure processing of lithography etc. Incidentally, the design of the alignment mark 30 is not limited to the one shown in FIGS. 1 and 2.

Figure 3:
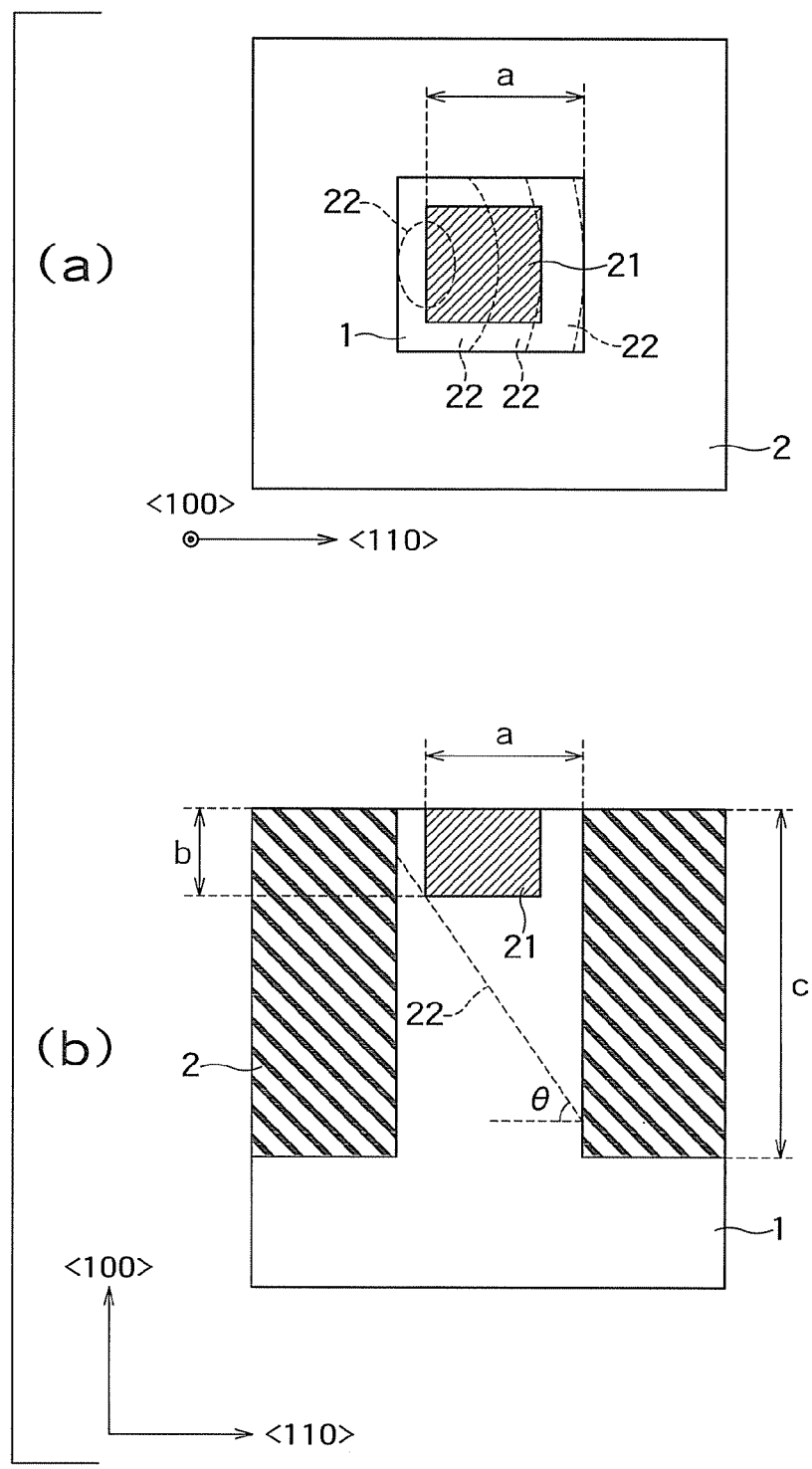
FIG. 3(a) is a partly enlarged view around a dummy pattern of the semiconductor device of FIG. 1.
FIG. 3(b) is a partly enlarged view around the dummy pattern of FIG. 2.

Next, a dislocation loop generated within the dummy pattern region 20 will be described with reference to FIG. 3. FIG. 3(*a*) is a partly enlarged view (top view) around the dummy pattern region 20 of the semiconductor device 100 of FIG. 1. FIG. 3(*b*) is a partly enlarged view (sectional view) around the dummy pattern region 20 of the semiconductor device 100 of FIG. 2.

A dislocation loop 22 might be generated from the interface between the epitaxial crystal layer 21 and the substrate 1. The dislocation loop 22 is a type of crystal defects, and is annular dislocation that extends on a (111) plane.

The dislocation loop 22 is generated, for example, by the surface of the substrate 1 thermally-expanding, a lattice mismatch growing on the interface between the epitaxial crystal layer 21 and the substrate 1, and dislocation moving in a <110> direction and multiplying. Therefore, the dislocation loop 22 is generated, for example, when thermal process is performed to activate an impurity diffusion region of the transistor formed on the substrate 1. The dislocation loop 22 is also likely generated particularly when relatively-short-time annealing for about several milliseconds, or Milli Second Annealing, such as flashlamp annealing and laser annealing, is used for thermal process.

The (111) plane of the substrate 1 that includes any points on the interface between the epitaxial crystal layer 21 and the substrate 1 is surrounded by the element isolation insulating film 2 in a deeper region than the epitaxial crystal layer 21. In this case, the dislocation loop 22 extends on the (111) plane, and cannot extend within the element isolation insulating film 2. Hence, even when the dislocation loop 22 is generated from any points on the interface between the epitaxial crystal layer 21 and the substrate 1, the extension of the dislocation loop 22 toward the depth direction of the substrate 1 is stopped by the element isolation insulating film 2. That is, the dislocation loop 22 is present only within the region right under the dummy pattern region 20 as shown in FIG. 3(*b*).

As stated above, in the present embodiment, the (111) plane of the substrate 1 that includes any points on the interface between the epitaxial crystal layer 21 and the substrate 1 is surrounded by the element isolation insulating film 2 in a deeper region than the epitaxial crystal layer 21. Therefore, the depth of the lowest point of the (111) plane at the deepest position of these (111) planes (i.e. the plane including the dislocation loop 22 shown in FIG. 3(*b*)) within the region right under the dummy pattern region 20 is shallower than the depth of the bottom surface of the element isolation insulating film 2.

In the case described above, the following equation (1) is valid as will be appreciated from FIGS. 3(*a*) and 3(*b*):

$$a \cdot \tan \theta < c - b \tag{1}$$

where
a: the maximum value of distances between one point on the interface between the epitaxial crystal layer 21 and the substrate 1, and the element isolation insulating film 2, in the <110> direction in the substrate 1 that is parallel to the surface of the substrate 1;
b: the depth of the epitaxial crystal layer 21;
c: the depth of the element isolation insulating film 2; and
θ: the angle between a (111) plane and a horizontal plane (i.e., a plane parallel to the surface of the substrate 1).

Also, in the present embodiment, since a plane direction of the principal surface of the substrate 1 is (100), the following equation (2) is valid.

$$\tan \theta = \sqrt{2} \tag{2}$$

Therefore, the following equation (3) is valid in the present embodiment.

$$\sqrt{2} a < c - b \tag{3}$$

The equation (3) is obtained by substituting the equation (2) for the equation (1).

Figure 4:
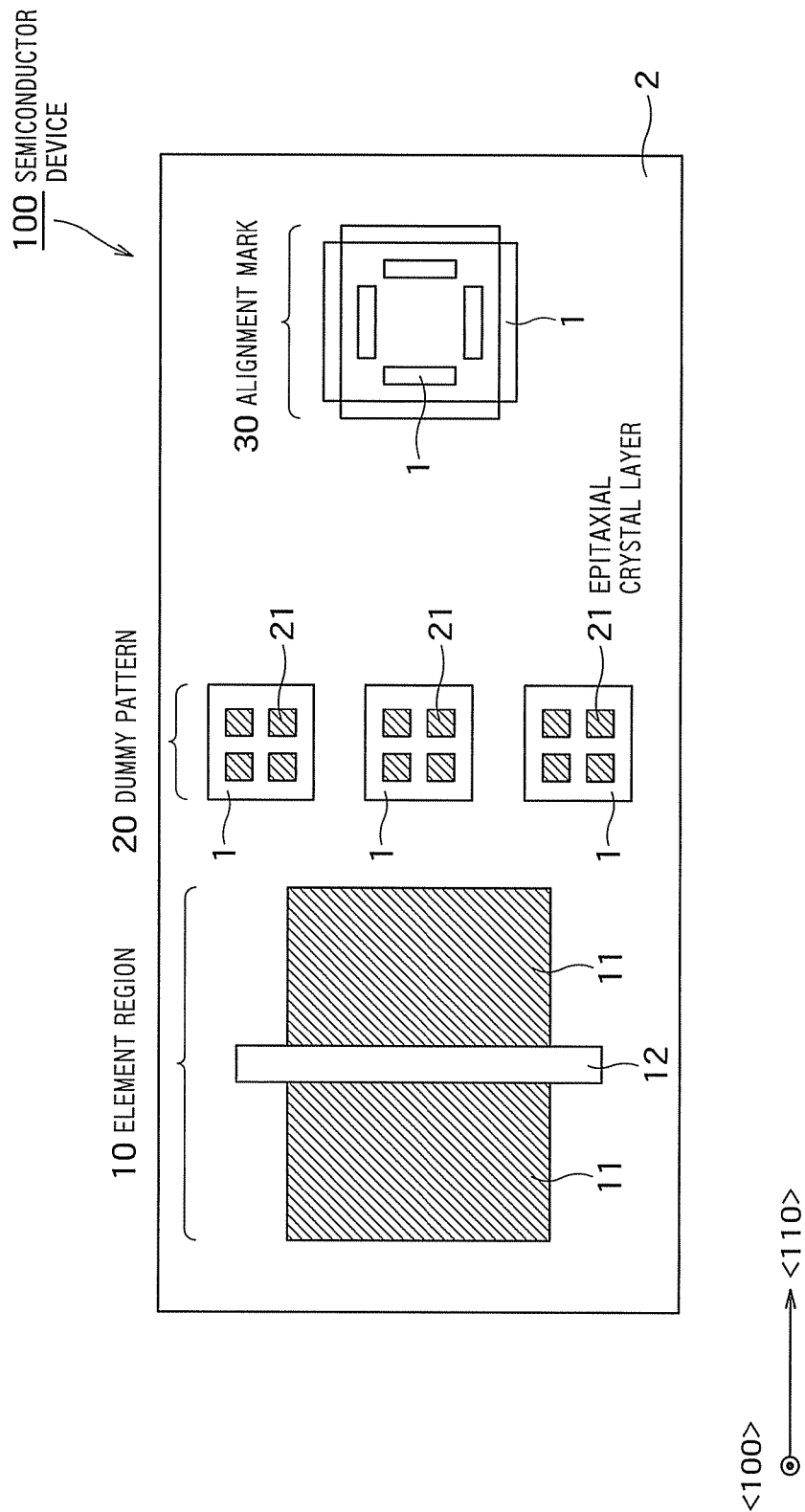
FIG. 4 is a top view of a semiconductor device according to a modification of the first embodiment.

Next, a modification of the present embodiment will be described. FIG. 4 is a top view of a semiconductor device according to a modification. The epitaxial crystal layer 21 within the dummy pattern region 20 is divided in a horizontal direction and formed as shown in FIG. 4. Also, in the case of the modification, the definition of the above parameters a, b, c, and θ is the same, and the equations (1) to (3) are valid with respect to those parameters.

Figure 5:
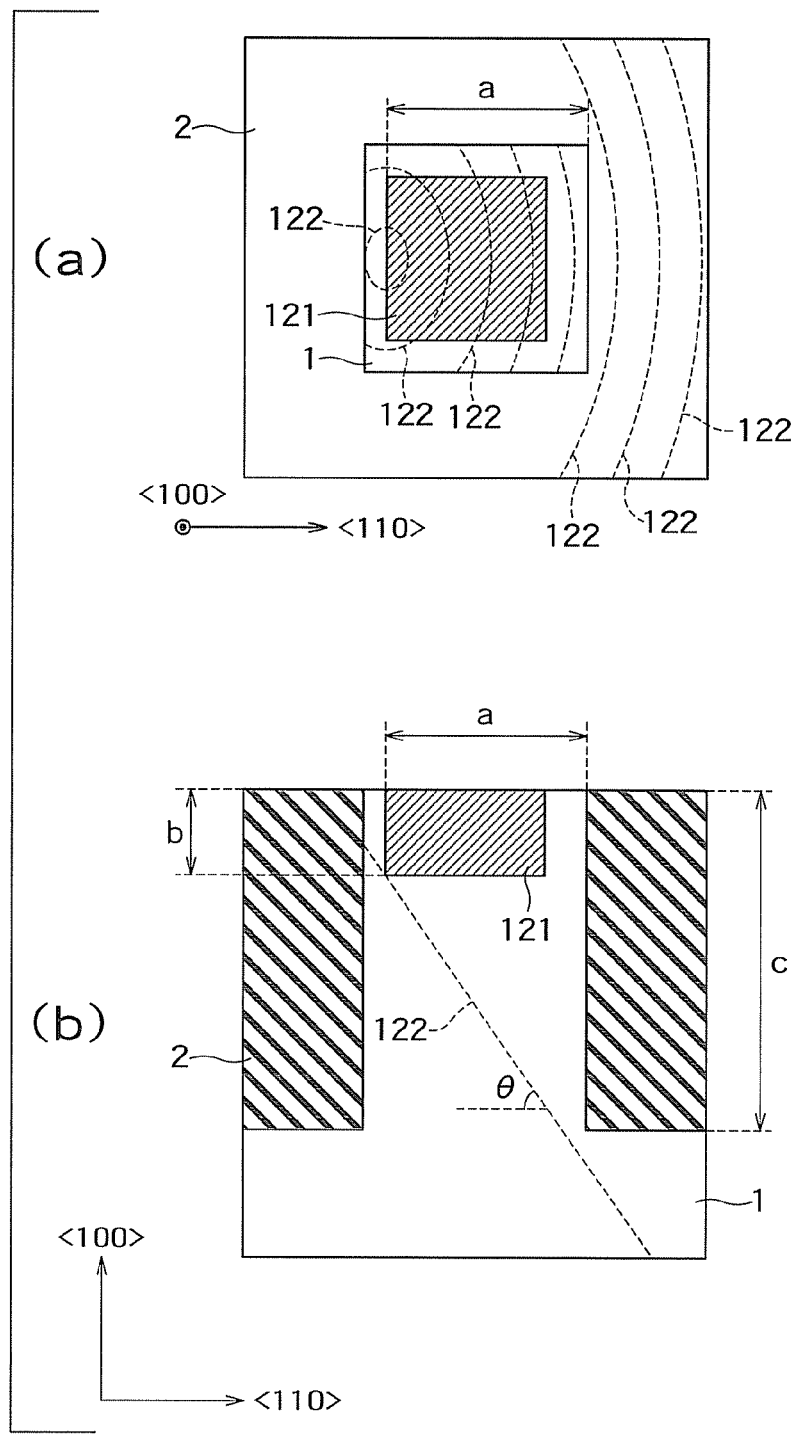
FIG. 5(a) is a top view around a dummy pattern of a semiconductor device according to a comparison example, and FIG. 5 (b) is a vertical sectional view around the dummy pattern of the semiconductor device according to the comparison example.

Next, a comparison example of the present embodiment will be described. FIGS. 5(*a*) and 5(*b*) are a semiconductor device according to the comparison example having a structure that does not satisfy the equation (1). FIG. 5(*a*) is a top view around a dummy pattern region of the semiconductor device according to the comparison example, and FIG. 5(*b*) is a vertical sectional view around the dummy pattern region of the semiconductor device according to the comparison example.

Since the structure of the semiconductor device according to the comparison example does not satisfy the equation (1), as shown in FIGS. 5(*a*) and 5(*b*), the extension of a portion of the dislocation loop (for example, a dislocation loop 122) generated from the interface between the epitaxial crystal layer 121 and the substrate 1, toward the depth direction cannot be stopped by the element isolation insulating film 2; thus, the dislocation loop 122 extends to a deeper position than the element isolation insulating film 2.

Accordingly, if the dislocation loop extends toward, for example, the element region, the dislocation core of the dislocation loop will capture metallic impurities in the Si substrate (gettering); thus, the junction leak of the transistor on the element region might be caused. Also, if the dislocation loop extends toward the alignment mark, a deviation might be caused in the alignment mark.

(Second Embodiment)

One of the differences between the second and first embodiments is a direction in a horizontal plane of the dummy pattern region 20 and the epitaxial crystal layer 21, to the crystal direction of the substrate 1. Incidentally, description of like things as the first embodiment will not be repeated or simplified in the following description of the present embodiment.

Figure 6:
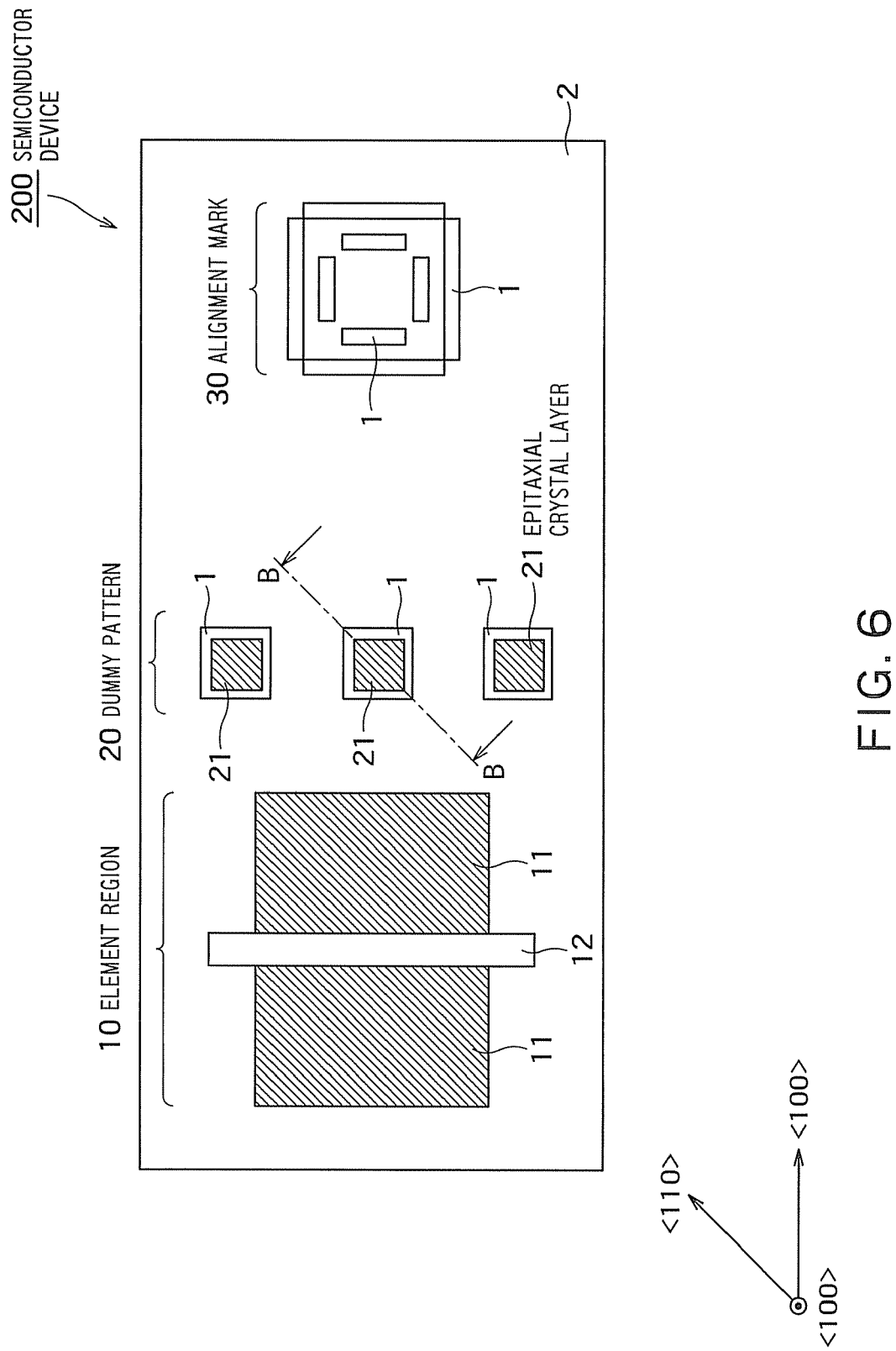
FIG. 6 is a top view of a semiconductor device according to a second embodiment.
Figure 7:
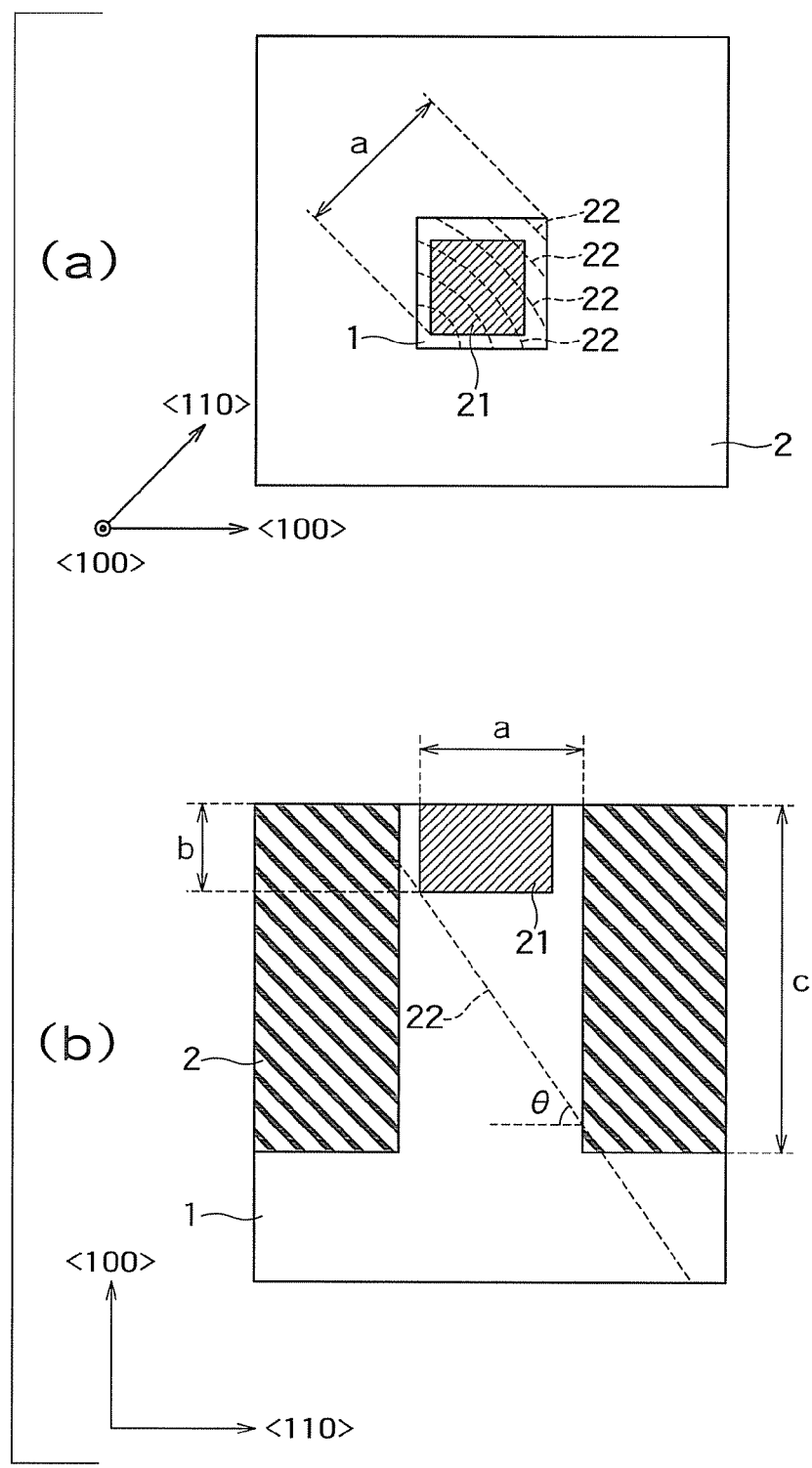
FIG. 7(a) is a partly enlarged view around a dummy pattern of the semiconductor device of FIG. 6.
FIG. 7(b) is a vertical sectional view of the semiconductor device taken on line B-B of FIG. 6.

FIG. 6 is a top view of a semiconductor device 200 according to the second embodiment. FIG. 7(a) is a partly enlarged view around the dummy pattern region 20 of the semiconductor device 200 of FIG. 6. FIG. 7(b) is a vertical sectional view of the semiconductor device 200 taken on line B-B of FIG. 6.

As shown in FIG. 6, the semiconductor device 200 includes the element isolation insulating film 2 formed on the substrate 1, the element region 10 demarcated by the element isolation insulating film 2 on the substrate 1, the dummy pattern region 20, the alignment mark 30, the epitaxial crystal layer 11 formed on the substrate 1 within the element region 10, and the epitaxial crystal layer 21 formed on the substrate 1 within the dummy pattern region 20.

A direction in a horizontal plane of the dummy pattern region 20 and the epitaxial crystal layer 21, to the crystal direction of the substrate 1 is different from that in the first embodiment. That is, a side of the dummy pattern region 20 and the epitaxial crystal layer 21 both of which are quadrangles is in a <110> direction in the first embodiment as shown in FIG. 3(a), while in a <100> direction in the second embodiment as shown in FIG. 7(a).

Therefore, a direction in a horizontal plane of the dislocation loop 22 to the dummy pattern region 20 and the epitaxial crystal layer 21 is different from that in the first embodiment as shown in FIG. 3(a) and FIG. 7(a).

The definition of the parameters a, b, c, and θ is the same as that in the first embodiment, and the equations (1) to (3) are satisfied. It should be noted that a direction in a horizontal plane of the dummy pattern region 20 and the epitaxial crystal layer 21, to the crystal direction of the substrate 1 is different from that in the first embodiment. Hence, even if the size of the dummy pattern region 20 and the epitaxial crystal layer 21 is the same as that in the first embodiment, the value of the parameter a will be different from that in the first embodiment.

(Third Embodiment)

One of the differences between the third and first embodiments is a plane direction of the principal surface of the substrate. Incidentally, description of like things as the first embodiment will not be repeated or simplified in the following description of the present embodiment.

Figure 8:
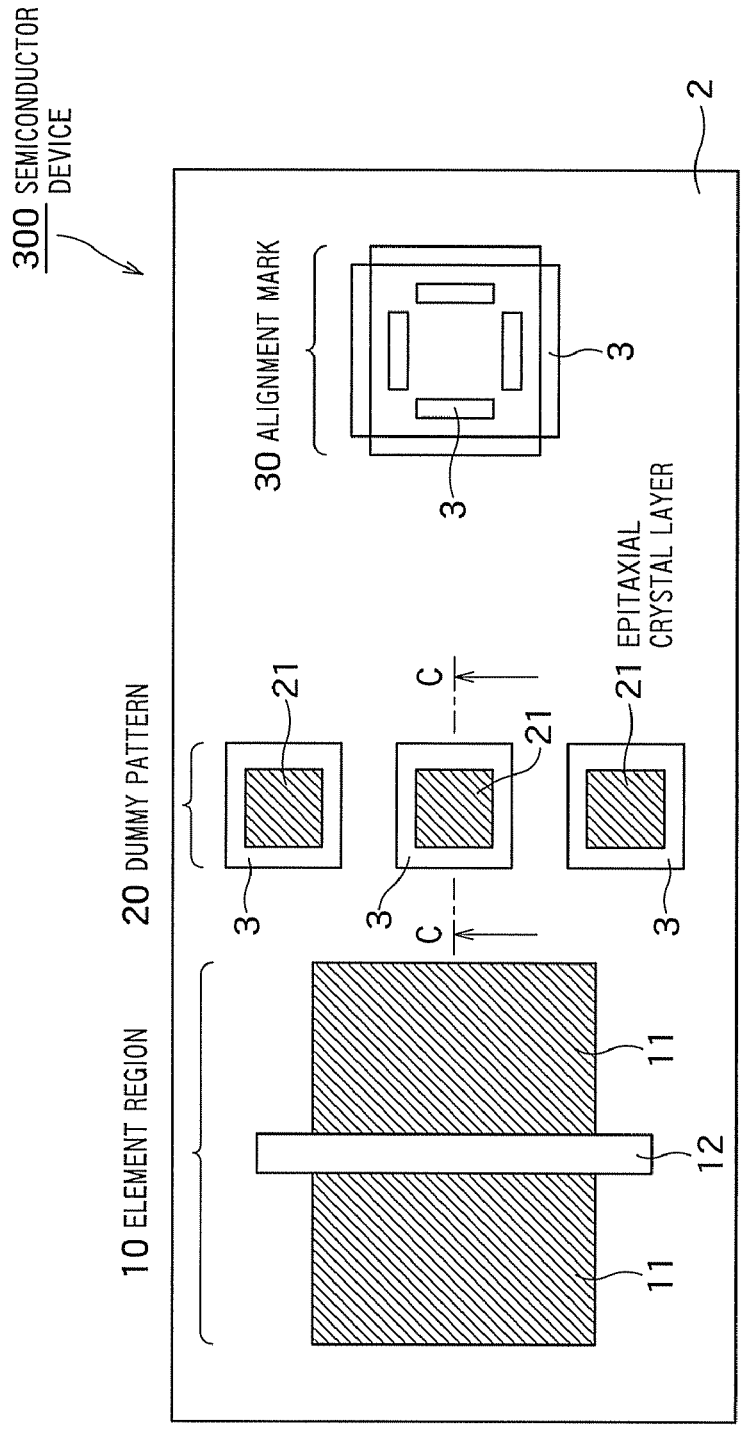
FIG. 8 is a top view of a semiconductor device according to a third embodiment.
Figure 9:
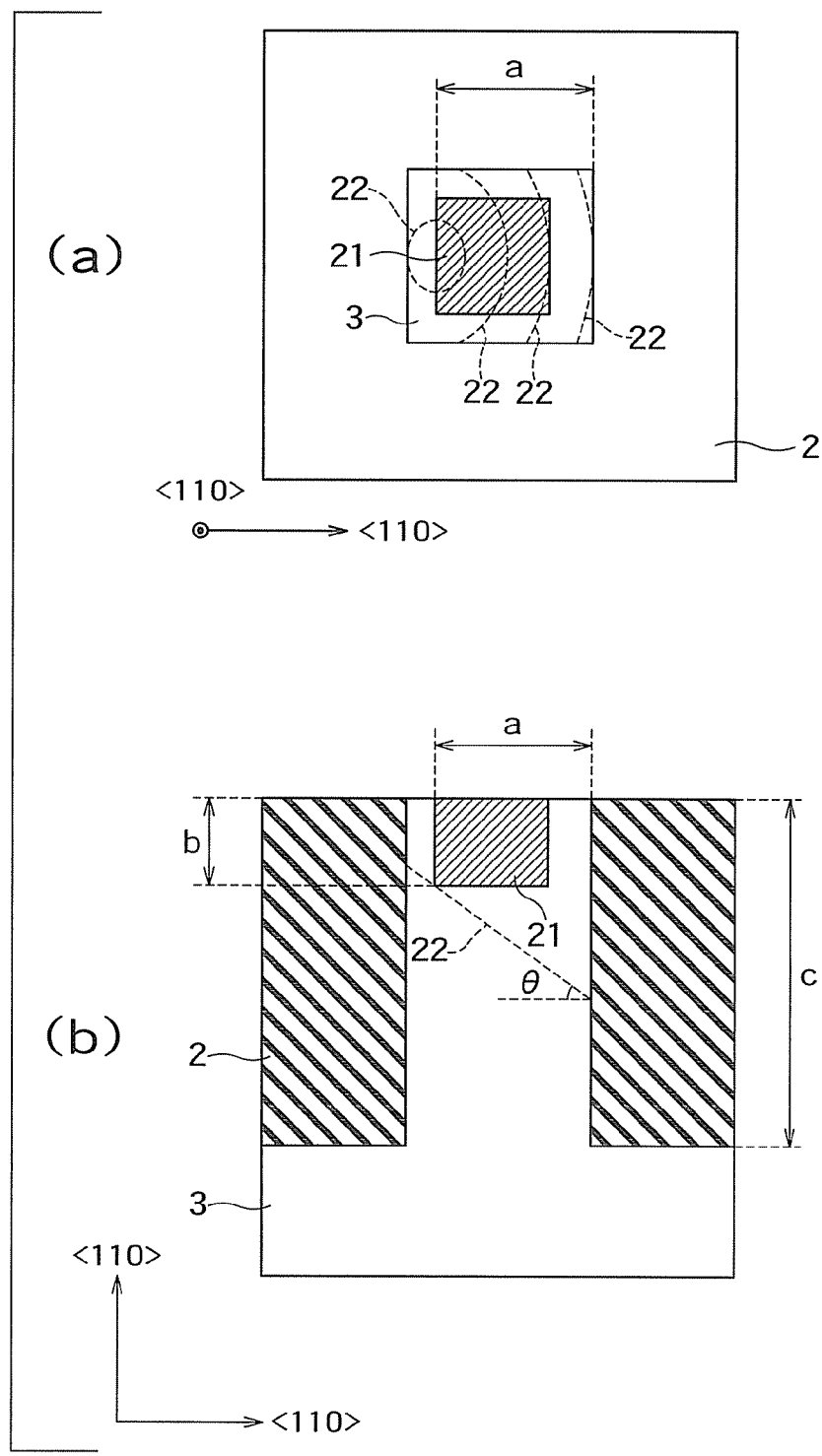
FIG. 9(a) is a partly enlarged view around a dummy pattern of the semiconductor device of FIG. 8.
FIG. 9(b) is a vertical sectional view of the semiconductor device taken on line C-C of FIG. 8.

FIG. 8 is a top view of a semiconductor device 300 according to the third embodiment. FIG. 9(a) is a partly enlarged view around the dummy pattern region 20 of the semiconductor device 300 of FIG. 8. FIG. 9(b) is a vertical sectional view of the semiconductor device 300 taken on line C-C of FIG. 8.

As shown in FIG. 8, the semiconductor device 300 includes the element isolation insulating film 2 formed on a substrate 3, the element region 10 demarcated by the element isolation insulating film 2 on the substrate 3, the dummy pattern region 20, the alignment mark 30, the epitaxial crystal layer 11 formed on the substrate 3 within the element region 10, and the epitaxial crystal layer 21 formed on the substrate 3 within the dummy pattern region 20.

A plane direction of the principal surface of the substrate 3 is (100).

The definition of the parameters a, b, c, and θ is the same as that in the first embodiment, and the equation (1) is satisfied.

It should be noted that, in the present embodiment, the following equation (4) is valid with respect to θ since the plane direction of the principal surface of the substrate 3 is (110).

$$\tan \theta = 1/\sqrt{2} \tag{4}$$

Therefore, the following equation (5) is valid in the present embodiment.

$$a/\sqrt{\sqrt{2}} < c - b \tag{5}$$

The equation (5) is obtained by substituting the equation (4) for the equation (1).

(Fourth Embodiment)

One of the differences between the fourth and third embodiments is a direction in a horizontal plane of the dummy pattern region 20 and the epitaxial crystal layer 21, to the crystal direction of the substrate 3. Incidentally, description of like things as the third embodiment will not be repeated or simplified in the following description of the present embodiment.

Figure 10:
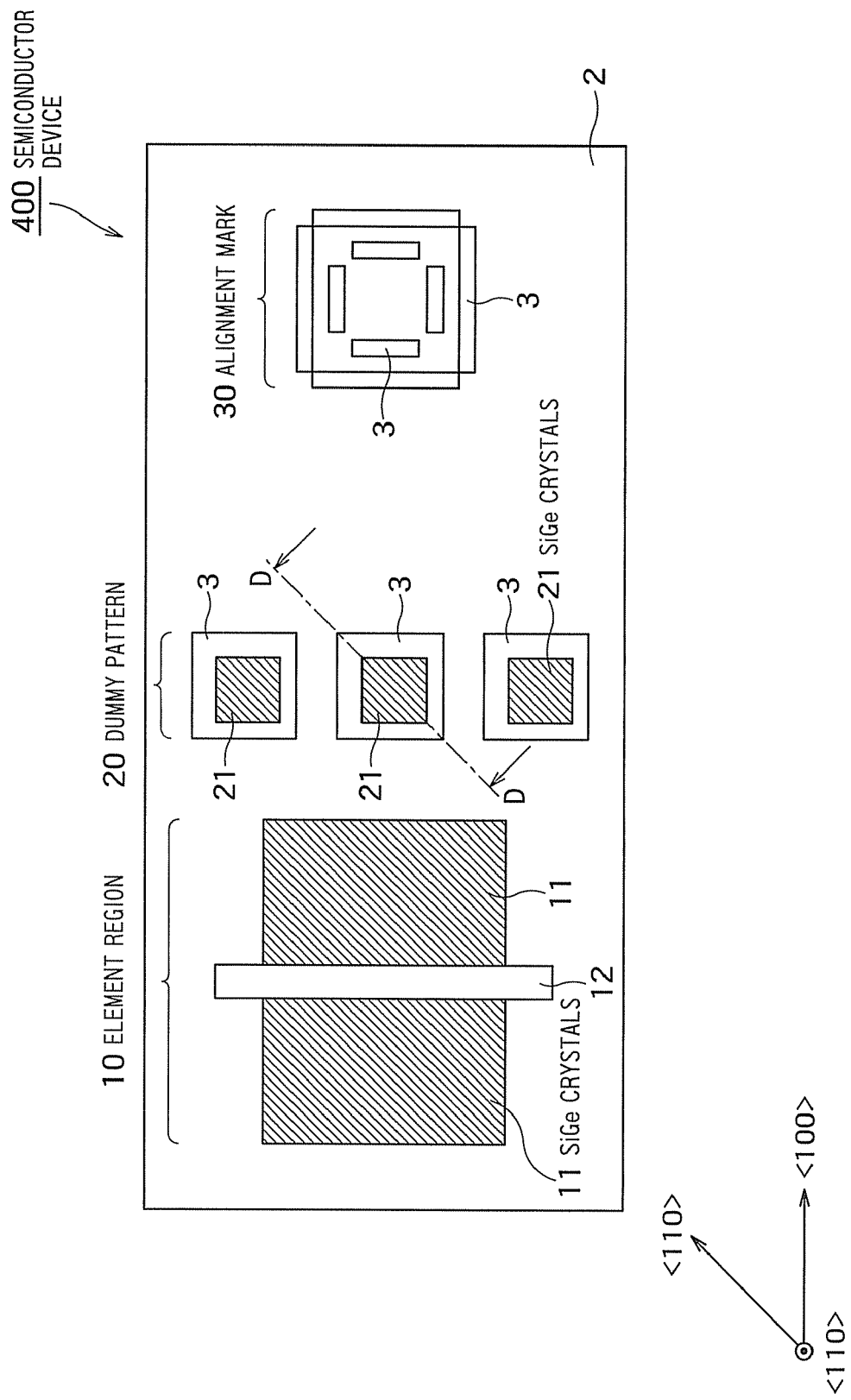
FIG. 10 is a top view of a semiconductor device according to a fourth embodiment.
Figure 11:
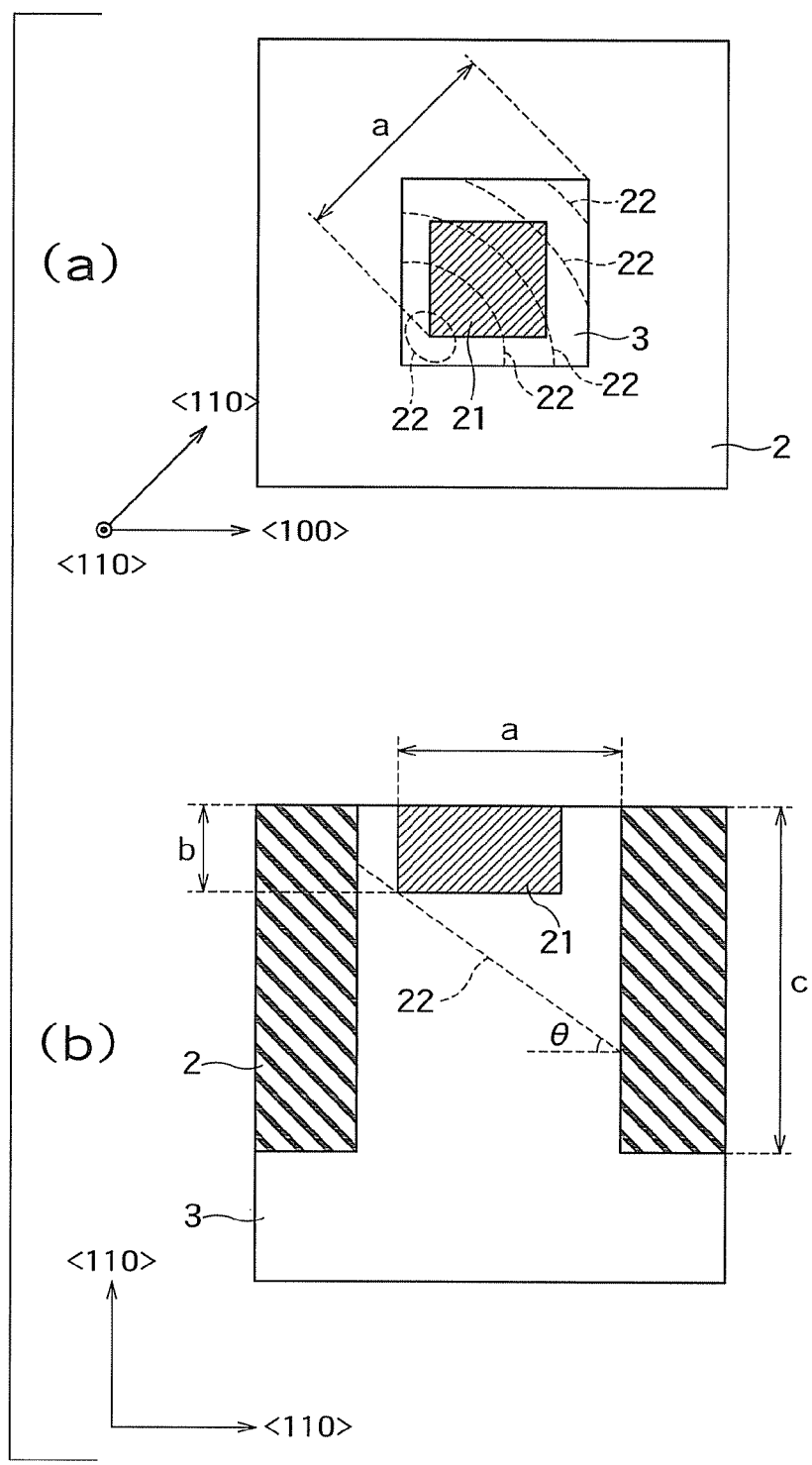
FIG. 11(a) is a partly enlarged view around a dummy pattern of the semiconductor device of FIG. 10.
FIG. 11(b) is a vertical sectional view of the semiconductor device taken on line D-D of FIG. 10.

FIG. 10 is a top view of a semiconductor device 400 according to the fourth embodiment. FIG. 11(a) is a partly enlarged view around the dummy pattern region 20 of the semiconductor device 400 of FIG. 10. FIG. 11(b) is a vertical sectional view of the semiconductor device 400 taken on line D-D of FIG. 10.

As shown in FIG. 10, the semiconductor device 400 includes the element isolation insulating film 2 formed on a substrate 3, the element region 10 demarcated by the element isolation insulating film 2 on the substrate 3, the dummy pattern region 20, the alignment mark 30, the epitaxial crystal layer 11 formed on the substrate 3 within the element region 10, and the epitaxial crystal layer 21 formed on the substrate 3 within the dummy pattern region 20.

A direction in a horizontal plane of the dummy pattern region 20 and the epitaxial crystal layer 21, to the crystal direction of the substrate 3 is different from that in the third embodiment. That is, a side of the dummy pattern region 20 and the epitaxial crystal layer 21 both of which are quadrangles is in a <110> direction in the third embodiment as shown in FIG. 9(a), while in a <100> direction in the fourth embodiment as shown in FIG. 11(a).

Therefore, a direction in a horizontal plane of the dislocation loop 22 to the dummy pattern region 20 and epitaxial crystal layer 21 is different from that in the third embodiment as shown in FIGS. 9(a) and 11(a).

The definition of the parameters a, b, c, and θ is the same as that in the third embodiment, and the equations (1), (4), and (5) are satisfied. It should be noted that a direction in a horizontal plane of the dummy pattern region 20 and the epitaxial crystal layer 21, to the crystal direction of the substrate 3 is different from that in the third embodiment. Hence, even if the size of the dummy pattern region 20 and the epitaxial crystal layer 21 is the same as that in the third embodiment, the value of the parameter a will be different from that in the third embodiment.

As stated above, according to the first to fourth embodiments, even when the dislocation loop 22 is generated within the dummy pattern region 20 from the interface between the epitaxial crystal layer 21 and the substrate 1 (3), the dislocation loop 22 cannot extend toward the outside of the region right under the dummy pattern region 20. Therefore, the junction leak of the transistor in the element region 10 and the deviation of the alignment mark 30 etc. can be prevented.

In the first to fourth embodiments, the surface shapes of the dummy pattern region 20 and the epitaxial crystal layer 21 are both a quadrangle by way of example. And, the semiconductor device is formed in such a manner that a direction of a side of the quadrangle is matched with the direction of the channel of the transistor formed within the element region 10.

That is, the first embodiment is an embodiment where a transistor of which a direction of a channel is <110> is formed on a substrate of which a plane direction of a principal surface is (100), the second embodiment is an embodiment where a transistor of which a direction of a channel is <100> is formed on a substrate of which a plane direction of a principal surface is (100), the third embodiment is an embodiment where a transistor of which a direction of a channel is <110> is formed on a substrate of which a plane direction of a principal surface is (110), and the fourth embodiment is an embodiment where a transistor of which a direction of a channel is <100> is formed on a substrate of which a plane direction of a principal surface is (110).

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor device, comprising:
   an element isolation insulating film formed on a substrate;
   an element region and a dummy pattern region demarcated by the element isolation insulating film on the substrate;
   a first epitaxial crystal layer formed on the substrate within the element region, and being made up of crystals that have a different lattice constant from that of the crystals that constitute the substrate; and
   a second epitaxial crystal layer formed on the substrate within the dummy pattern region, and being made up of the same crystals as the first epitaxial crystal layer,
   the (111) plane of the substrate that includes any points on an interface between the second epitaxial crystal layer and the substrate being surrounded by the element isolation insulating film in a deeper region than the second epitaxial crystal layer,
   wherein the second epitaxial crystal layer is embedded within a trench formed on the surface of the substrate, and the side surface and the bottom surface of the second epitaxial crystal layer contact the substrate.

2. The semiconductor device of claim 1, wherein a plane direction of the principal surface of the substrate is (100), and the semiconductor device has a structure that satisfies the following equation (1):

$$\sqrt{2}a < c - b \quad (1)$$

where a: a maximum value of distances between one point on the interface between the second epitaxial crystal layer and the substrate, and the element isolation insulating film, in the <110> direction in the substrate that is parallel to the surface of the substrate; b: the depth of the second epitaxial crystal layer; and c: the depth of the element isolation insulating film.

3. The semiconductor device of claim 2, wherein a dislocation loop generated from the interface is present only within the region right under the dummy pattern region.

4. The semiconductor device of claim 2, wherein the substrate is made up of Si based crystals, and the first and second epitaxial crystal layers are made up of SiGe or SiC.

5. The semiconductor device of claim 2, further comprising an alignment mark demarcated by the element isolation insulating film on the substrate.

6. The semiconductor device of claim 2, wherein the surface shapes of the dummy pattern region and second epitaxial crystal layer are a quadrangle, and a direction of a side of the quadrangle is matched with a direction of a channel of the transistor formed within the element region.

7. The semiconductor device of claim 1, wherein a plane direction of the principal surface of the substrate is (110), and the semiconductor device has a structure that satisfies the following equation (2):

$$a/\sqrt{2} < c - b \quad (2)$$

where a: a maximum value of distances between one point on the interface between the second epitaxial crystal layer and the substrate, and the element isolation insulating film, in the <110> direction in the substrate that is parallel to the surface of the substrate; b: the depth of the second epitaxial crystal layer; and c: the depth of the element isolation insulating film.

8. The semiconductor device of claim 7, wherein a dislocation loop generated from the interface is present only within the region right under the dummy pattern region.

9. The semiconductor device of claim 7, wherein the substrate is made up of Si based crystals, and the first and second epitaxial crystal layers are made up of SiGe or SiC.

10. The semiconductor device of claim 7, further comprising an alignment mark demarcated by the element isolation insulating film on the substrate.

11. The semiconductor device of claim 7, wherein the surface shapes of the dummy pattern region and the second epitaxial crystal layer are a quadrangle, and a direction of a side of the quadrangle is matched with a direction of a channel of the transistor formed within the element region.

12. The semiconductor device of claim 1, wherein the dislocation loop generated from the interface is present only within the region right under the dummy pattern region.

13. The semiconductor device of claim 1, wherein the substrate is made up of Si based crystals, and the first and second epitaxial crystal layers are made up of SiGe or SiC.

14. The semiconductor device of claim 1, further comprising an alignment mark demarcated by the element isolation insulating film on the substrate.

15. The semiconductor device of claim 1, wherein the surface shapes of the dummy pattern region and the second epitaxial crystal layer are a quadrangle, and a direction of a side of the quadrangle is matched with a direction of a channel of the transistor formed within the element region.

16. The semiconductor device of claim 1, wherein the side surface of the first epitaxial crystal layer contacts the element isolation insulating film.

* * * * *